United States Patent [19]

Wright

[11] Patent Number: 5,073,763

[45] Date of Patent: Dec. 17, 1991

[54] GROUP SINGLE-PHASE UNIDIRECTIONAL TRANSDUCERS WITH ⅜λ AND ⅝λ SAMPLING

[75] Inventor: Peter Wright, Dallas, Tex.

[73] Assignee: R.F. Monolithics, Inc., Dallas, Tex.

[21] Appl. No.: 608,354

[22] Filed: Nov. 2, 1990

[51] Int. Cl.$^5$ ................. H03H 9/145; H01L 41/08
[52] U.S. Cl. .................... 333/193; 333/196; 310/313 B
[58] Field of Search .................. 333/150–154, 333/193–196; 310/313 R, 313 B, 313 C, 313 D

[56] References Cited

U.S. PATENT DOCUMENTS

| | | | |
|---|---|---|---|
| 3,792,381 | 2/1974 | Bristol | 333/193 |
| 3,946,342 | 3/1976 | Hartmann | 333/196 |
| 3,979,702 | 9/1976 | Humsinger et al. | 310/313 C X |
| 4,353,046 | 10/1982 | Hartmann | 333/194 |
| 4,866,325 | 9/1989 | Kodama et al. | 310/313 B |
| 4,902,925 | 2/1990 | Wright | 310/313 B |
| 4,910,839 | 3/1990 | Wright | 29/25.35 |

FOREIGN PATENT DOCUMENTS

| | | | |
|---|---|---|---|
| 0145716 | 8/1985 | Japan | 333/195 |
| 0009216 | 1/1988 | Japan | 333/196 |
| 0255263 | 2/1988 | Japan | 333/195 |
| 0136706 | 6/1988 | Japan | 333/193 |

*Primary Examiner*—Eugene R. LaRoche
*Assistant Examiner*—Seung Ham
*Attorney, Agent, or Firm*—Jones, Day, Reavis & Pogue

[57] ABSTRACT

Novel GSPUDT structures are disclosed with ⅜λ and ⅝λ group sampling with 3λ and 5λ group responses. Reflectionless or unidirectional transducers, and broadband notch elements are all implementable with these new configurations. These GSPUDTs are similar to the conventional SPUDT and the "Hopscotch" transducers in that single level versions are reflectionless. Unidirectional characteristics are only obtainable from a two-level structure.

34 Claims, 8 Drawing Sheets

GROUP SINGLE-PHASE UNIDIRECTIONAL TRANSDUCERS WITH ⅜λ AND ⅛λ SAMPLING

FIELD OF THE INVENTION

The present invention relates in general to surface acoustic wave transducers and in particular to a new class of group-type single-phase unidirectional transducers (GSPUDTs) that can obtain unidirectional characteristics on conventional (CSPUDT) or natural (NSPUDT) crystal orientations. The sense of unidirectionality can be reversed by a simple change to the second level metalization.

BACKGROUND OF THE INVENTION

Surface acoustic wave devices known as SAW devices have many uses in the UHF and VHF frequency ranges. SAW devices have been especially useful as impedance elements, resonators, and bandpass filters in these frequency ranges. Typical saw devices have a substrate with at least a surface layer of piezoelectric material and surface acoustic wave transducers in interdigitated form disposed on the piezoelectric surface. The transducers convert an electric signal to surface acoustic waves propagating on the piezoelectric surface.

SAW devices are compact, lightweight, robust, and, because they are a planar technology, are economical to manufacture. They can be mass-produced using the same techniques developed so successfully for the production of silicon integrated circuits. A wide variety of analogue signal processing functions can be achieved with SAW devices. Among other applications, they are currently used in pulse compression radar systems as receiver bandpass filters, or as resonators for stabilizing oscillators in numerous applications. They have replaced many of the coils, capacitors, and metal cavities of conventional radio frequency systems, removing the need for hand alignment and dramatically improving the reliability and performance. They have simultaneously resulted in significant reductions in both size and cost.

However, several problems are associated with the prior art surface acoustic wave transducers. One of the problems occurs because the transducer electrodes cause internal reflections which distort the transducer output and the shape of the input conductance. Another problem occurs when the transducer is used in filter applications. Triple transit distortion is caused by regeneration reflections between the transducers.

In order to eliminate triple transit distortion, three-phase and single-phase devices are used to cause a greater amount of radiation in one direction in the crystal than in the reverse direction and thus form unidirectional transducers. In one configuration proposed for a single-phase unidirectional transducer (SPUDT), a device such as that disclosed in U.S. Pat. No. 4,353,046 is constructed in which the acoustic reflections are used to cancel the regenerative reflections and unidirectional behavior results. These transducers are simple to fabricate and tune and thereby overcome many disadvantages of the multiphase devices. However, in early devices the finger and gap widths in a single-phase unidirectional transducer (SPUDT) were of split-finger construction and were one-eighth (⅛) of the operating acoustic wave length, thus limiting the frequency range of the device by photolithographic constraints to a maximum frequency of operation when compared to the simplest form of SAW transducer using quarter wavelength electrodes. As further explained in U.S. Pat. No. 4,353,046, the reason the split-finger SAW device becomes unidirectional is that alternate fingers of the split-finger electrodes are loaded with extra material. However, in experiments to date, insufficient distributed reflectivity has been achieved with this structure to produce useful directivity levels. The source of the problem was found to be that the reflectivity of λ/8 electrodes is generally very small. The reflectivity was also found to increase only very slightly with metal thickness. The reason for this unexpected behavior was finally identified as energy storage at the electrode edges.

With λ/4 electrodes, the reflectivity is unaffected by energy storage as the contributions from the front and back edges cancel. However, at other electrode widths they can significantly affect the value of the reflectivity. Unfortunately, experimental measurements show that for electrode widths of less than λ/4, the energy-storage reflections are generally of opposite phase to those resulting from the impedance discontinuities. The result is a substantial reduction in the electrode reflectivity for electrode widths less than λ/4. As a result of this phenomenon, all further development of this split-finger SPUDT configuration was discontinued.

Later, another two-level SPUDT configuration was proposed in U.S. Pat. No. 4,902,925, incorporated herein by reference in its entirety. This structure, commonly known as the "Hopscotch", employed a group type sampling with all electrode widths λ/4. Like the original SPUDT configuration, the first level of the "Hopscotch" transducer by virtue of the electrode groupings has no net internal reflections. Unidirectionality is only achieved by the addition of a second level metalization with this structure. However, since the electrode widths are λ/4, rather than λ/8 as in the original split-finger structure, greater internal reflectivity levels could be achieved. Unfortunately, as a result of the sparse group type sampling in the structure, the effective coupling is substantially reduced. The latter severely limits the maximum bandwidth or minimum insertion loss achievable with this transducer. In addition, this structure has significant group responses not far below the passband.

Independent from the "Hopscotch" transducer, another concept for a SPUDT was proposed which relies on unique crystal orientations as set forth in commonly assigned U.S. Pat. No. 4,910,839, incorporated herein by reference in its entirety. On these unique crystal orientations, a simple two-electrode-per-wavelength transducer exhibits unidirectional characteristics. Unfortunately, on these natural SPUDT (NSPUDT) orientations, the sense of directionality is determined by material properties of the crystal substrate and overlay material rather than by the transducer configuration as with other approaches. Reversing the sense of the directivity of the transducer thus turns out to be extremely difficult. To date, a low-loss filter comprising two NSPUDTs has not yet been built because of the difficulties in getting the two transducers to communicate with each other.

One solution to the NSPUDT dilemma would be to implement a low-loss filter with an NSPUDT and a group-type SPUDT (GSPUDT), such as the "Hopscotch" transducer. The filter function could then be implemented essentially by the NSPUDT, and the GSPUDT could simply be designed to have a sufficiently wide pass band and low loss. The undesired out-of-band group responses of the GSPUDT could be eliminated from the overall filter response by the NSPUDT. Unfortunately, the "Hopscotch" GSPUDT configuration cannot be made unidirectional on an NSPUDT orientation. This is a consequence of the sampling in the structure. Thus, an alternative GSPUDT configuration would be required for this application.

The present invention relates to GSPUDT structures with $\frac{3}{8}\lambda$ and $\frac{3}{8}\lambda$ sampling. Reflectionless or unidirectional transducers and broad-band notch elements are all implementable with these new configurations. The novel class of GSPUDTs disclosed herein is similar to the conventional SPUDT (CSPUDT) and the "Hopscotch" transducers in that single-level versions are reflectionless. Unidirectional characteristics are obtainable only from the two-level structure. However, in many cases they have significant advantages over either of the previous structures. These advantages are (1) they can be made unidirectional on either CSPUDT or NSPUDT crystal orientations; (2) they can be made unidirectional in either the forward or reverse directions by a simple change to the second level metalization; (3) they have substantially greater coupling, in some cases, than prior art transducers; and (4) they have greater minimum geometry, in some cases, than some prior art transducers. Thus, this type of transducer can be advantageously used in combination with an NSPUDT transducer to implement low-loss filters, resonators or the like.

The novel SAW transducers disclosed herein have a pattern of interdigitated electrodes on a piezoelectric substrate. The electrodes lie on the substrate on either a $\frac{3}{8}\lambda$ or $\frac{3}{8}\lambda$ grid such that adjacent electrodes have either a center-to-center spacing of $\frac{3}{8}\lambda$ or a center-to-center spacing of $\frac{3}{8}\lambda$. The electrodes do not have to be physically located at every $\frac{3}{8}\lambda$ or $\frac{3}{8}\lambda$ grid. The transducer can be withdrawal weighted in a well-known manner in the art to achieve a desired transduction characteristic by actually removing various electrodes or by changing the polarity of certain electrodes. The important element of the invention is to have a $\frac{3}{8}\lambda$ or $\frac{3}{8}\lambda$ group type sampling which means that however the transducer is withdrawal weighted, the remaining electrodes are always centered on the $\frac{3}{8}\lambda$ or $\frac{3}{8}\lambda$ grid with any adjacent electrodes having either a $\frac{3}{8}\lambda$ or $\frac{3}{8}\lambda$ center-to-center spacing depending upon whether the transducer is a $\frac{3}{8}\lambda$ structure or a $\frac{3}{8}\lambda$ structure. For discussion purposes herein and for ease of explanation, the transducers will be shown and discussed with an electrode centered at each $\frac{3}{8}\lambda$ grid or at each $\frac{3}{8}\lambda$ grid.

In the embodiment of the novel GSPUDT transducer having $\frac{3}{8}\lambda$ group sampling, the physical structure includes a plurality of first pairs of interdigitated electrodes placed on a substrate with each first pair of electrodes having a center-to-center spacing of $\frac{3}{8}\lambda$ and reversed polarity from the preceding first pair. A plurality of second pairs of electrodes, each pair with a center-to-center spacing of $\frac{3}{8}\lambda$, are interdigitated with the plurality of the first pairs of electrodes. Both electrodes in each second pair have a polarity opposite the polarity of, and a center-to-center spacing of $\frac{3}{8}\lambda$ with, the adjacent electrodes of a first pair. The pattern of the electrodes repeats itself each three wavelengths or each five wavelengths. The structure of the $\frac{3}{8}\lambda$ sampled GSPUDT is identical to the $\frac{3}{8}\lambda$ structure just disclosed except for the $\frac{3}{8}\lambda$ center-to-center spacing.

Mass loading only one electrode of each of the second pair of electrodes and its adjacent first pair electrode obtains unidirectional transmission in one direction in the substrate. Mass loading only the other electrode of each of the second pair of electrodes and its adjacent first pair electrode obtains unidirectional transmission in the other direction in the substrate.

The novel transducers can be used on either NSPUDT crystal orientations or conventional crystal orientations because they can be made to radiate in either direction on either CSPUDT crystal orientations or NSPUDT crystal orientations, thus allowing filters, resonators and the like to be built on either conventional or CSPUDT crystal orientations or NSPUDT crystal orientations.

SUMMARY OF THE INVENTION

Thus, the present invention relates to an improved surface acoustic wave transducer comprising a pattern of interdigitated electrodes on a piezoelectric substrate, the interdigitated electrodes lying on either a $\frac{3}{8}\lambda$ grid or a $\frac{3}{8}\lambda$ grid such that adjacent electrodes have a center-to-center spacing of $\frac{3}{8}\lambda$ or $\frac{3}{8}\lambda$ where $\lambda$=one wave length.

The invention also relates to a surface acoustic wave transducer having a pattern of interdigitated electrodes on a piezoelectric substrate and comprising a plurality of first pairs of interdigitated electrodes, each said pair of electrodes having reversed polarity from the preceding first pair, a plurality of second pairs of electrodes interdigitated with said plurality of first pairs of electrodes, and both electrodes in each second pair having a polarity opposite the polarity of the adjacent first pair electrodes.

The invention also relates to a surface acoustic wave filter of the type having input and output spaced aligned transducers with at least one of the transducers being the new GSPUDT transducer disclosed herein.

BRIEF DESCRIPTION OF THE DRAWINGS

These and other objects of the present invention will be more fully disclosed in conjunction with the Detailed Description and the accompanying drawings in which.

DETAILED DESCRIPTION OF THE DRAWINGS

Figure 1A:
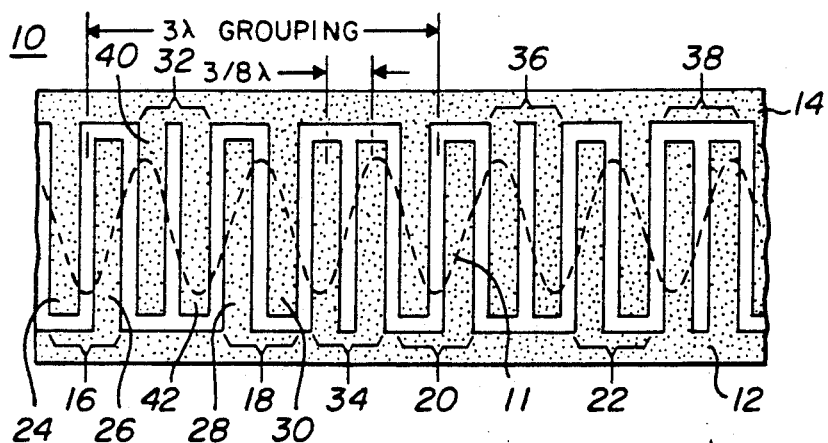
FIG. 1A is a diagrammatic representation of a single-level reflectionless transducer of the present invention with a $\frac{3}{8}\lambda$ periodicity, the electrodes in FIG. 1A have a width of $\lambda/4$ and the spaces separating each adjacent pair of electrodes are $\lambda/8$ in width.
Figure 1B:
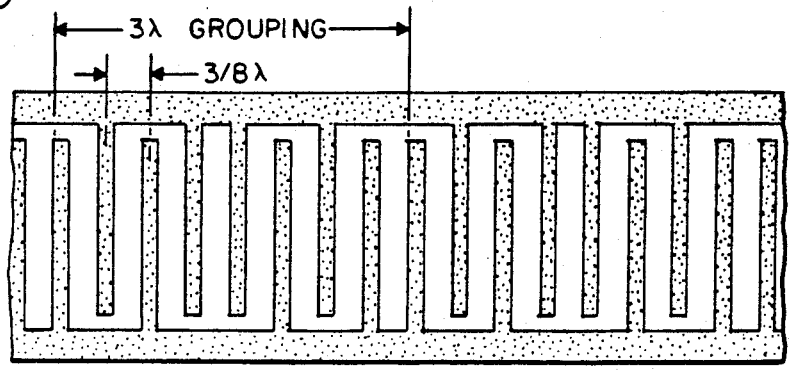
FIG. 1B is a diagrammatic representation of a transducer identical to that illustrated in FIG. 1A except that the electrode widths are $\lambda/8$ and the gaps separating adjacent electrodes are $\lambda/4$. As in FIG. 1A, the periodicity or center-to-center spacing between adjacent electrodes is $\frac{3}{8}\lambda$.
Figure 1C:
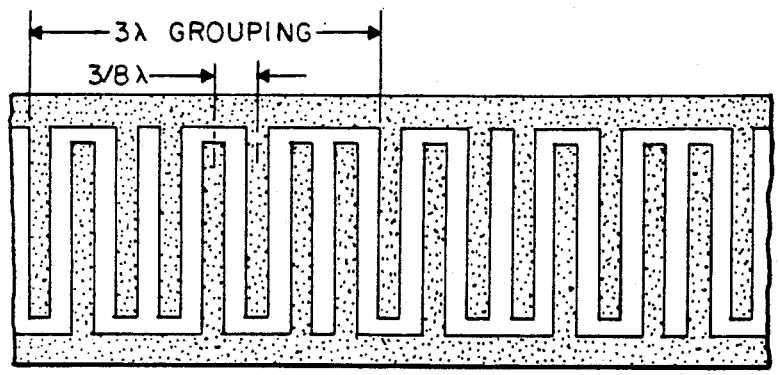
FIG. 1C is a schematic representation of a transducer identical to those in FIGS. 1A and 1B except that the electrode width is $3/16\lambda$ and the gap width separating adjacent electrodes is $3/16\lambda$. Again, the periodicity is $\frac{3}{8}\lambda$ and the pattern repeats itself every three wavelengths.
Figure 2A:
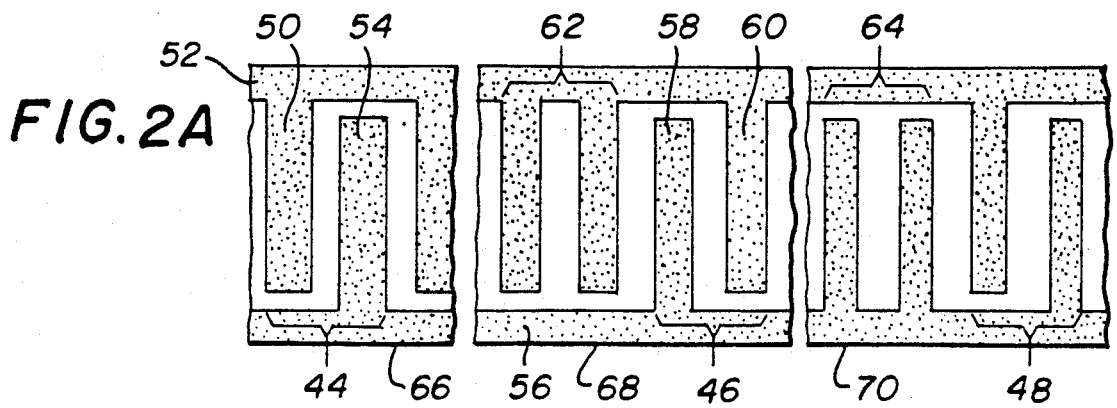
FIG. 2A is a schematic representation of a transducer structure utilizing $\frac{3}{8}\lambda$ sampling or periodicity with a center-to-center spacing of $\frac{3}{8}\lambda$ between adjacent electrodes and illustrating that the transducer can be constructed with a 5λ grouping and $\frac{3}{8}\lambda$ periodicity by making the electrode widths either $\frac{1}{8}\lambda$, 5/16λ or $\frac{1}{4}\lambda$ while making the corresponding gap widths $\frac{1}{4}\lambda$, 5/16λ or $\frac{1}{8}\lambda$, respectively.
Figure 2B:
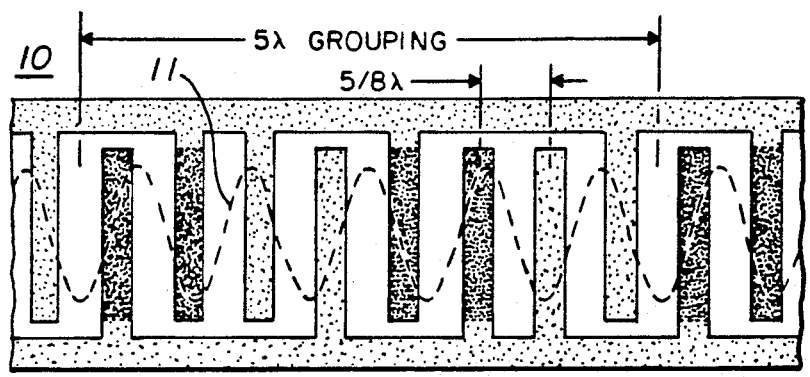
FIG. 2B is a schematic representation of the transducer illustrated in FIG. 2A disclosing the mass loading of the proper electrodes to obtain forward unidirectional transmission on a substrate with a conventional crystal orientation.
Figure 2C:
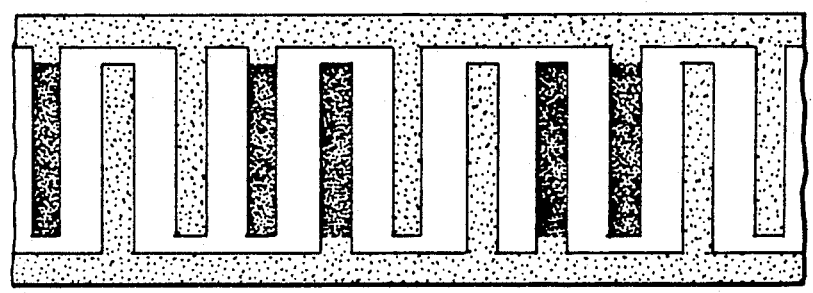
FIG. 2C is a schematic representation of the transducer illustrated in FIG. 2A illustrating the mass loading of the proper electrodes to obtain a reverse unidirectional transmission on a substrate with a conventional crystal orientation.
Figure 2D:
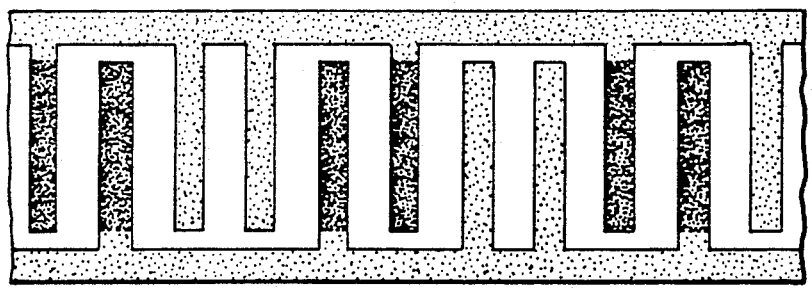
FIG. 2D is a schematic representation of the novel transducer illustrated in FIG. 2A showing the mass loading of the proper electrodes to obtain forward unidirectional transmission on a crystal substrate with an NSPUDT orientation.
Figure 2E:
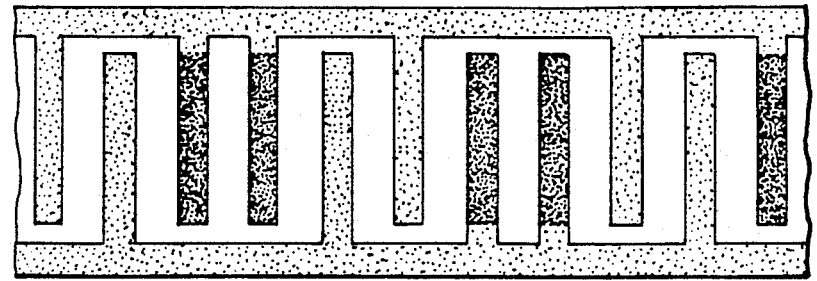
FIG. 2E is a schematic representation of the transducer shown in FIG. 2A illustrating the mass loading of the proper electrodes to obtain
reverse unidirectional transmission on a crystal substrate with an NSPUDT orientation.

The first level of the novel GSPUDT transducer configuration with a $\frac{3}{8}\lambda$ periodicity is shown in FIG. 1A. The first level of a corresponding transducer with $\frac{3}{8}\lambda$ periodicity is shown in FIG. 2A. Both of the single level configurations have no net distributed internal reflections at the design frequency. In each case, the lowest Fourier component of the surface potential on the electrodes is shown superimposed in dotted lines 11 in both figures. It will be noted in FIGS. 1A, 1B and 1C that the $\frac{3}{8}$ths periodicity or sampling does not change and a 3λ group repetition rate is maintained. However, in FIG. 1A, the electrodes are $\frac{1}{4}\lambda$ in width while the gaps are $\frac{1}{8}\lambda$ in width. In FIG. 1B, the electrodes have a λ/8 width and the gaps have a λ/4 width. In FIG. 1C, the electrodes have a 3/16λ width and the gaps have a 3/16λ width. As will be seen hereafter, in all three cases the desired advantages are obtained and are accompanied with only a change in the magnitude of coupling and reflectivity. The same analysis applies to FIG. 2A where the electrode widths in each case can be $\frac{3}{8}\lambda$, 5/16λ or $\frac{1}{4}\lambda$ and the corresponding gap widths are λ/4, 5/16λ and $\frac{3}{8}\lambda$, respectively.

It will be noted in FIG. 1A that the transducer 10 has conductive pads 12 and 14 from which extend electrodes in an interdigitated fashion. It will also be noted in both FIG. 1A that a plurality of first pairs of interdigitated electrodes 16, 18, 20 and 22 extend from conductive pads 12 and 14 such that each pair of electrodes 16, 18, 20 and 22 have reversed polarity from the preceding first pair. Thus, it will be noticed that in electrode pair 16, the first electrode 24 extends from transducer pad 14, while the second electrode 26 extends from transducer pad 12. Note the next first pair 18 has the first electrode 28 extending from transducer pad 12 instead of 14 and the second electrode 30 extends from transducer pad 14 instead of transducer pad 12. Thus, each first pair of the electrodes 16, 18, 20 and 22 has reversed polarity from the preceding first pair. Further, a plurality of second pairs of electrodes 32, 34, 36 and 38 are interdigitated with the plurality of first pairs of electrodes 16, 18, 20 and 22. Note that both electrodes in each of the second pairs of electrodes 32, 34, 36 and 38 have a common polarity which is opposite the polarity of the adjacent electrodes of a first pair. Thus, electrodes 40 and 42 forming pair 32 are both coupled to transducer pad 14 while the adjacent first pair electrodes 26 and 28 are both coupled to transducer pad 12. Thus, the electrodes 40 and 42 forming second pair 32 are of a common polarity that is of opposite polarity than the adjacent electrodes 26 and 28. In like manner, second pair of electrodes 34 also have a common but different polarity than the adjacent electrodes in first pairs 18 and 20.

The same distinction is applied to the $\frac{3}{8}\lambda$ transducer structure illustrated in FIG. 2A. Thus, in FIG. 2A, a plurality of first pairs of interdigitated electrodes 44, 46 and 48 are shown. Each pair of those electrodes have a reversed polarity from the preceding pair. Thus, in pair 44, electrode 50 extends from pad 52 while electrode 54 extends from transducer pad 56. The next of the first pairs of interdigitated electrodes 46 has the first electrode 58 extending from transducer conductive pad 56, instead of 52, and the second electrode 60 of pair 46 extends from conductive pad 52 instead of 56. An examination will show that all of the electrodes of the first pairs 44, 46 and 48 follows the same pattern. Further, a plurality of second pairs of electrodes 62 and 64 are interdigitated with the plurality of first pairs of electrodes 44, 46 and 48 as shown. Both electrodes in each of the second pairs 62 and 64 have a common polarity opposite the polarity of the adjacent first pairs of electrodes, as can be seen. Again in FIG. 2A the pattern repeats in five wavelengths. Further, each of the adjacent electrodes have a center-to-center separation of $\frac{3}{8}\lambda$. However, the width of the electrodes and gaps may vary as shown without changing the $\frac{3}{8}\lambda$ periodicity. The transducer 10 in FIG. 2A has been conveniently shown in three sections 66, 68 and 70. The physical width of the electrodes and gaps in each section vary in the drawings but a transducer can be constructed with the same $\frac{3}{8}\lambda$ periodicity but have one of a number of electrode widths and gap widths. In the first section 66, electrodes are represented to be $\frac{3}{8}\lambda$ in width with the gaps $\lambda/4$ in width. In the second section 68, the electrodes are represented to be $5/16\lambda$ in width and the gaps also have $5/16\lambda$ width. In the third section 70, the electrodes are represented to have a width of $\frac{1}{4}\lambda$ and the gaps a width of $\frac{3}{8}\lambda$. The three sections 66, 68 and 70 are shown in FIG. 2A merely for illustration. In actuality, the entire transducer 10 would have all one size electrodes and all the gaps would be of one size, but they could vary in width such as the three combinations shown so long as the $\frac{3}{8}\lambda$ periodicity is maintained. Again, FIG. 2B, FIG. 2C, FIG. 2D and FIG. 2E illustrate how the second level of the $\frac{3}{8}\lambda$ transducer can be mass loaded or weighted to obtain unidirectional transmission in either forward or reverse directions on either a CSPUDT or NSPUDT crystal orientation.

Figure 5:
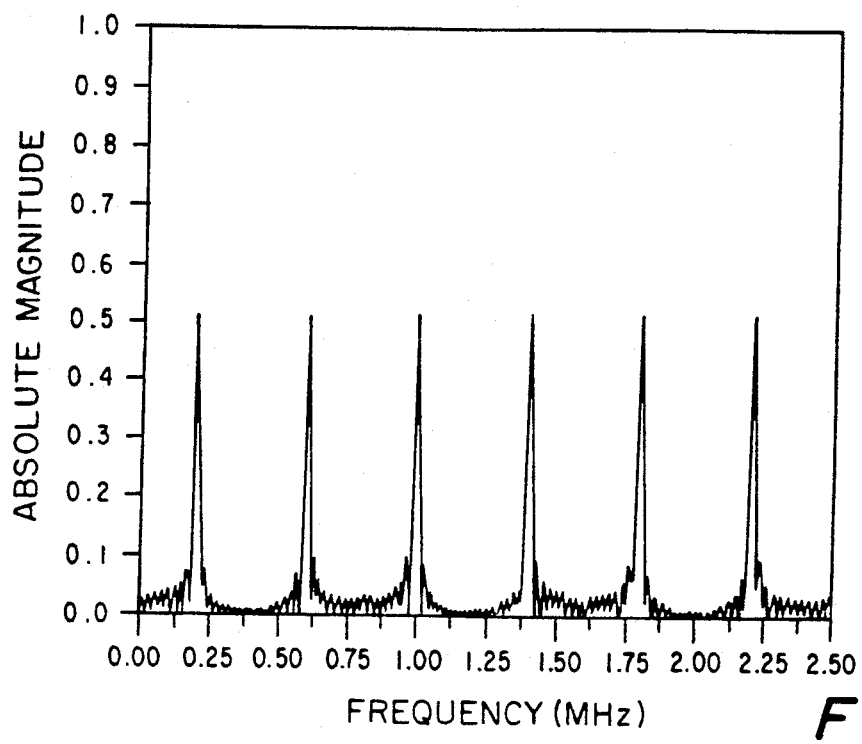
FIG. 5 is a graph illustrating the absolute magnitude of the coupling of the prior art two-group sampling GSPUDT known as the "Hopscotch"
Figure 9:
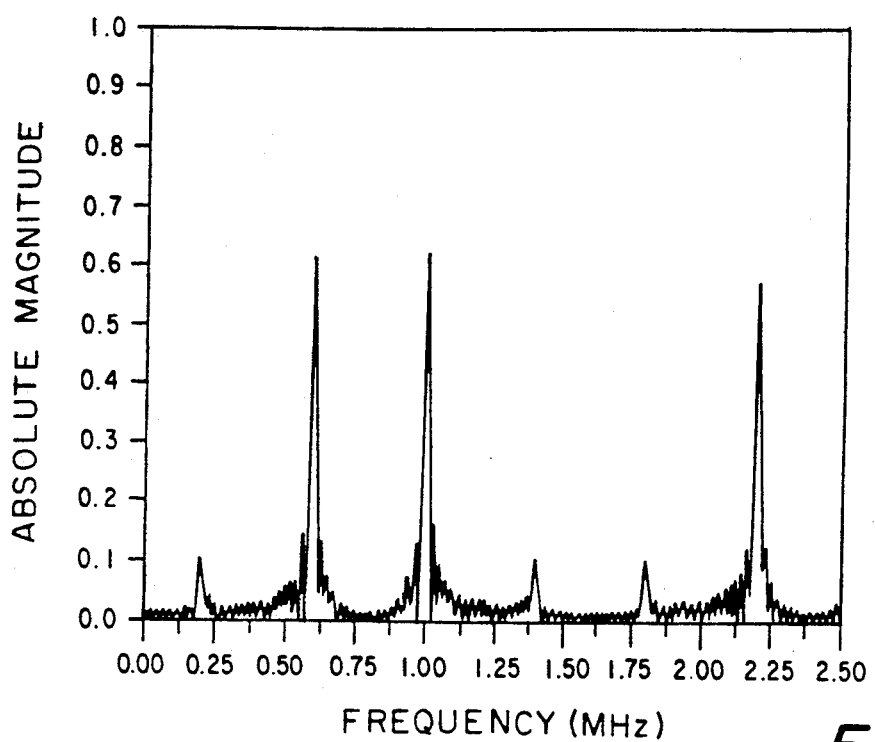
FIG. 9 is a diagram of the absolute magnitude of the coupling of the novel $\frac{3}{8}$ths two-level GSPUDT disclosed herein.

As indicated earlier, both of the single level configurations illustrated in FIGS. 1A and 2A have no net distributed internal reflections. In most cases, if the single level configurations of FIG. 1A and 2A were fabricated for reflectionless transducer applications, a metalization of fifty percent (50%) would be employed. Thus, in the $\frac{3}{8}\lambda$ sampling transducer in FIG. 1A, the electrodes and gaps would both have the width of $3/16\lambda$, while in the $\frac{3}{8}\lambda$ sampling structure shown in FIG. 2A, both the electrodes and the gaps would have the width of $5/16\lambda$. The $\frac{3}{8}\lambda$ reflectionless transducer configuration in FIG. 2A is extremely useful in implementing high frequency reflectionless transducers since it has a larger minimum geometry than a two-group "Hopscotch" and has essentially a similar coupling strength. Compare FIGS. 5 and 9 in which FIG. 5 is the absolute magnitude of the coupling of the two-group "Hopscotch" and FIG. 9 is the absolute magnitude of the coupling of the $\frac{3}{8}\lambda$ two-level GSPUDT. Because the minimum geometry for the "Hopscotch" is $\frac{1}{4}\lambda$, the new $\frac{3}{8}\lambda$ sample structure shown in FIG. 2A can be built at frequencies much higher. Thus, the $\frac{3}{8}\lambda$ sample structure is a significant advance in SAW technology for realizing high frequency reflectionless transducers.

Figure 3:
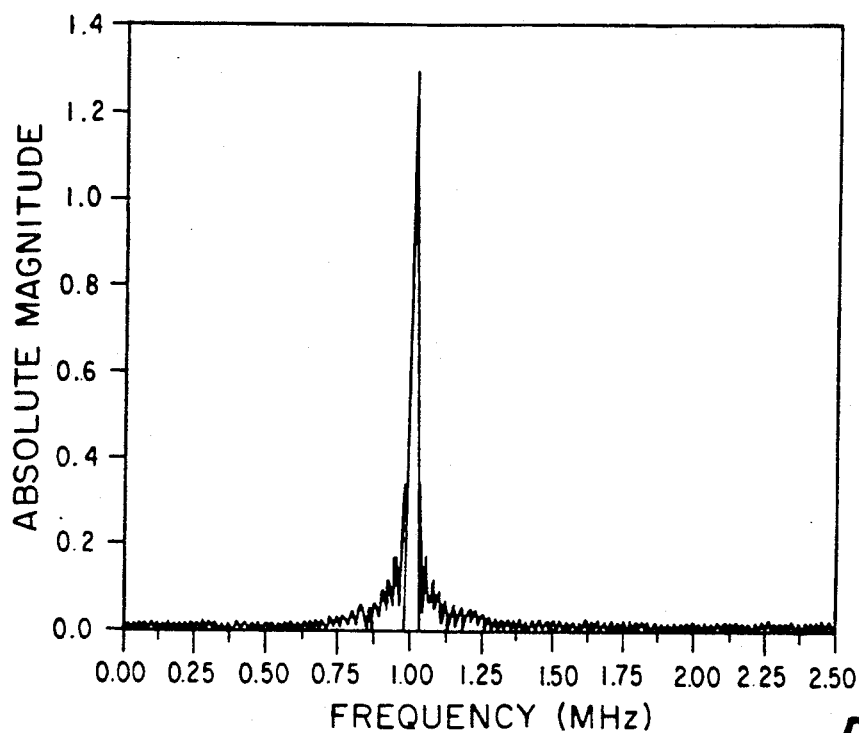
FIG. 3 is a graph illustrating the absolute magnitude of the coupling of a prior art two-electrode/wavelength transducer.
Figure 7:
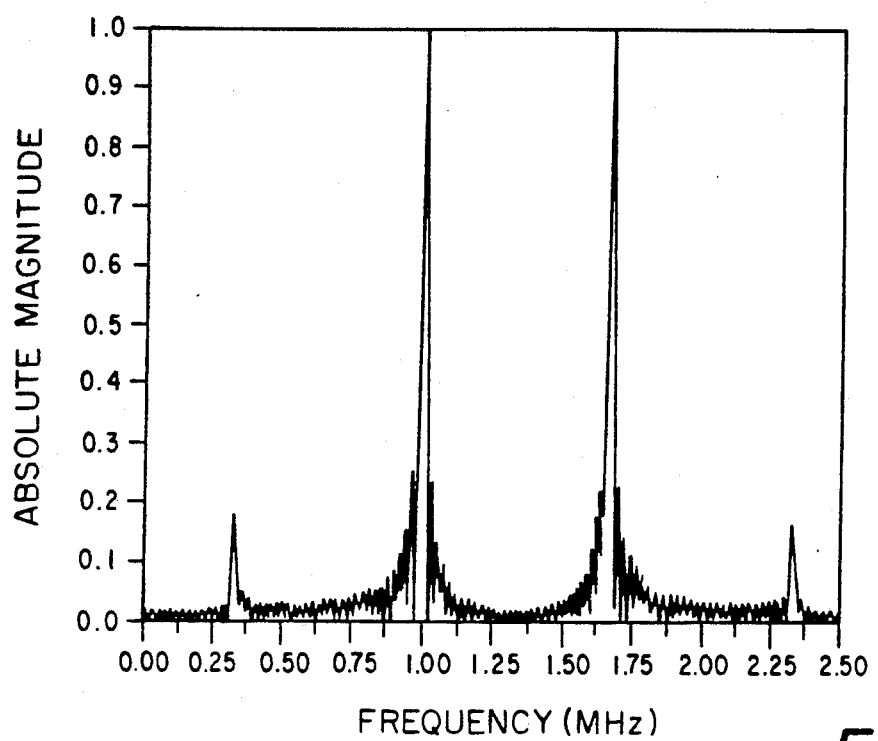
FIG. 7 is a graph of the absolute magnitude of the coupling of the novel $\frac{3}{8}$ths two-level GSPUDT of the present invention.

Compare the $\frac{3}{8}\lambda$ group sampled GSPUDT with a prior art two-electrode/wavelength transducer such as the NSPUDT transducer disclosed in U.S. Pat. No. 4,910,839. FIG. 3 illustrates the coupling of a prior art two-electrode per wavelength transducer. It shows a normalized absolute magnitude of approximately 1.3. FIG. 7 illustrates the coupling of the $\frac{3}{8}\lambda$ GSPUDT disclosed herein. It shows a normalized absolute magnitude of 1.0, almost as good as the coupling of the prior art two-electrode per wavelength transducer.

Figure 4:
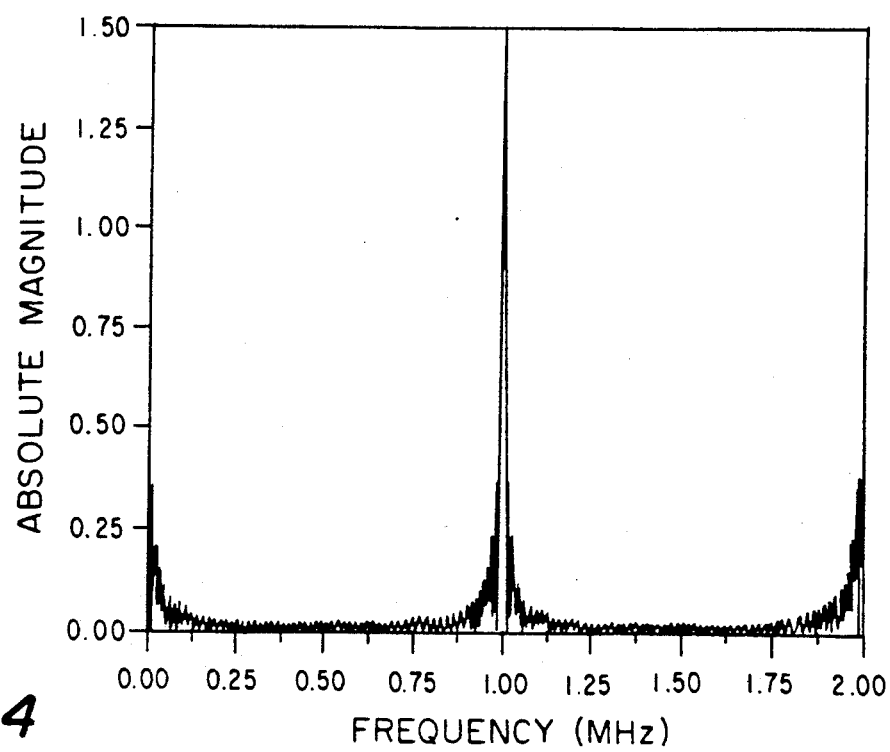
FIG. 4 is a graph illustrating the absolute magnitude of the reflectivity of a prior art two-electrode/wavelength transducer.
Figure 8:
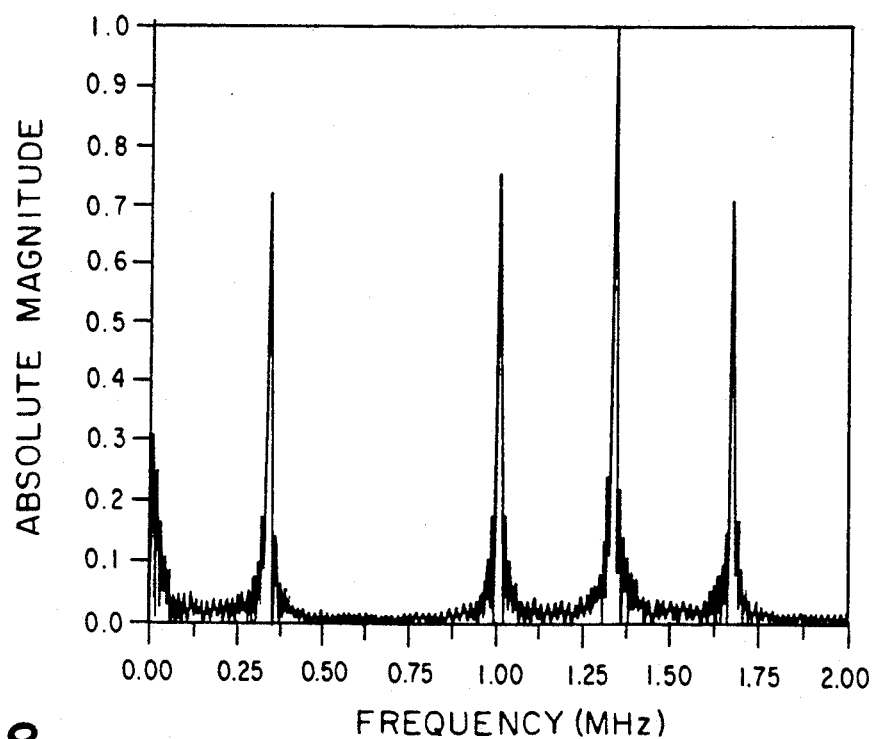
FIG. 8 is a graph of the absolute magnitude of the reflectivity of the novel $\frac{3}{8}$ths two-level GSPUDT of the present invention.

FIG. 4 shows the absolute normalized value of the reflectivity of the prior art two-electrode per wavelength transducer to be approximately 1.5 while FIG. 8 shows the absolute normalized value of the reflectivity of the novel $\frac{3}{8}\lambda$ GSPUDT to be approximately 0.75. Thus, the $\frac{3}{8}\lambda$ GSPUDT shows excellent coupling and good reflectivity although not as good as the NSPUDT two-electrode per wavelength transducer. FIG. 7 also shows a group-type response 70% below the passband with small coupling so it is essentially negligible. Thus, the $\frac{3}{8}\lambda$ GSPUDT will function well in other applications including filter applications using other $\frac{3}{8}\lambda$ GSPUDT transducers as well as other transducers including an NSPUDT two-electrode per wave length transducer.

When the novel $\frac{3}{8}\lambda$ GSPUDT transducer is compared with the two-electrode per wavelength "Hopscotch" transducer, the $\frac{3}{8}\lambda$ GSPUDT is much superior. The coupling of the "Hopscotch" is shown in the normalized graph of FIG. 5 and is shown to be approximately 0.52. The coupling of the $\frac{3}{8}\lambda$ GSPUDT is shown in the normalized graph of FIG. 7 to be approximately 1.0 or approximately twice as strong as the "Hopscotch" transducer. Further, the "Hopscotch" generates undesirable multiple group type responses that have couplings that are substantially equal to the magnitude of the coupling in the passband. However, the $\frac{3}{8}\lambda$ GSPUDT, as shown in FIG. 7, generates only one group type response below the passband that is removed 70% and has only approximately 0.16 coupling magnitude. It is of little consequence. The strong group type response 70% above the passband can easily be accommodated with proper matching networks.

Figure 6:
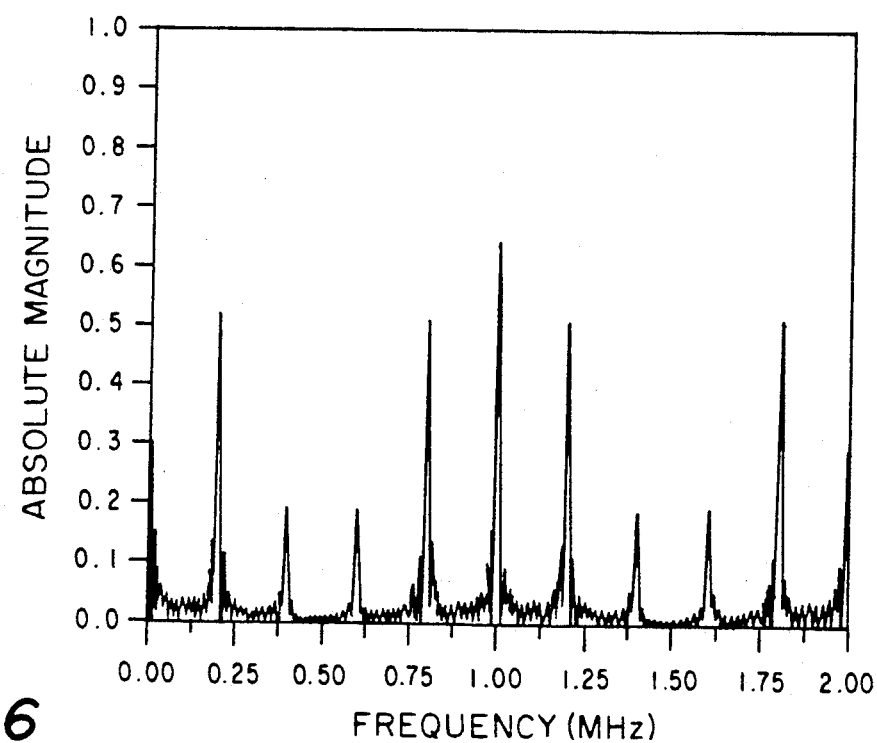
FIG. 6 is a graph illustrating the absolute magnitude of the reflectivity of the prior art two-group sampling "Hopscotch"

Note also in FIGS. 6 and 8 that the reflectivity of the novel $\frac{3}{8}\lambda$ GSPUDT is better than the "Hopscotch".

Figure 10:
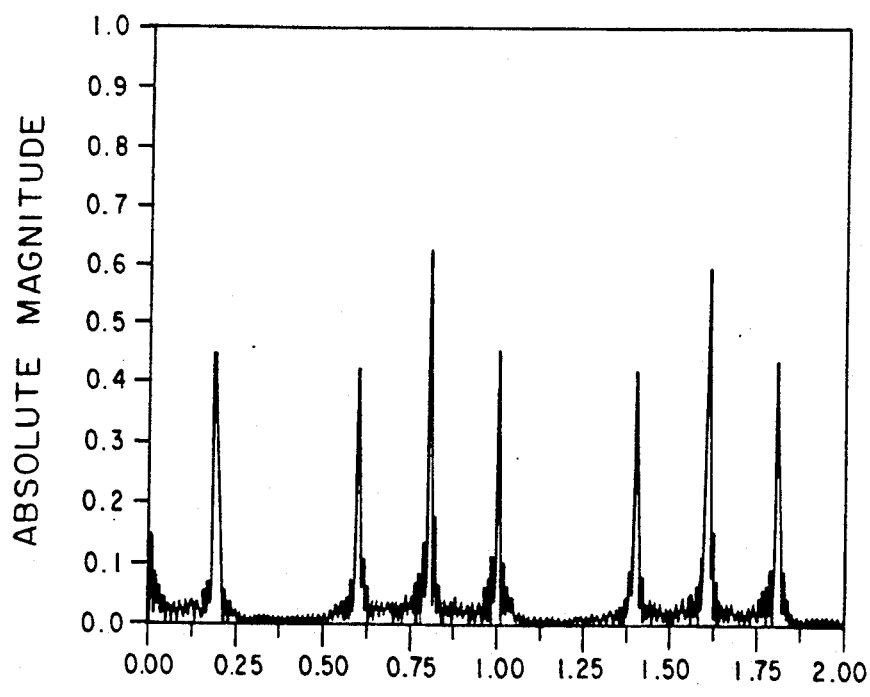
FIG. 10 is a diagram of the absolute magnitude of the reflectivity of the novel $\frac{3}{8}$ths two-level GSPUDT disclosed herein.

When comparing the coupling of the novel $\frac{3}{8}\lambda$ GSPUDT shown in FIG. 9 with the two-electrode per wavelength transducer coupling shown in FIG. 3, it will be seen that the $\frac{3}{8}\lambda$ coupling is good but less than the two-electrode per wavelength device. Also, the reflectivity shown in FIG. 10 is low but sufficient for many applications. Thus, the $\frac{3}{8}\lambda$ GSPUDT will also function well for higher frequency applications using other $\frac{3}{8}\lambda$ GSPUDT transducers as well as other transducers including the two-electrode per wavelength transducer such as the NSPUDT disclosed in U.S. Pat. No. 4,910,839.

When comparing the coupling of the novel $\frac{3}{8}\lambda$ GSPUDT as shown in FIG. 9 with the "Hopscotch" coupling shown in FIG. 5, it will be seen that both devices generate a group type response about 40% below the passband and having the same amplitude as the signal in the passband. However, the $\frac{3}{8}\lambda$ GSPUDT coupling is essentially the same as that for the "Hopscotch" transducer. Its reflectivity is slightly smaller in the passband as can be seen by comparing FIG. 10 at 1 MHz with FIG. 6 at 1 MHz. However, it has a larger minimum geometry. Thus, the novel ⅜λ GSPUDT is comparable with, and in some cases has advantages over, the "Hopscotch" transducer disclosed in U.S. Pat. No. 4,902,928.

The real advantages of the new ⅜λ and ⅝λ transducer configurations, however, only become truly apparent when the addition of the second level metalization is considered. Both the conventional SPUDT (split-finger electrodes) and the "Hopscotch" transducer configurations can be made to exhibit unidirectional characteristics on conventional crystal orientations (i.e. symmetric as defined in U.S. Pat. No. 4,910,839) by the addition of a second level metalization on selected electrodes. Unfortunately, neither of these configurations can be made to be unidirectional on an NSPUDT orientation. Both configurations were originally proposed only for use on conventional orientations and were not considered for NSPUDT orientation use. However, because of the problems encountered in reversing the directivity of the NSPUDT as set forth earlier, the need arises for another low-loss transducer that might be used with the NSPUDT transducer to realize a low-loss filter. The present ⅜λ and ⅝λ sampled structures can be made relatively broadband, with low loss and are ideal for this application.

The reason that neither the CSPUDT nor the "Hopscotch" transducers can be made unidirectional on an NSPUDT orientation is a direct consequence of their geometry. In both configurations, all the electrodes are located either $\pm\lambda/8$ relative to the imposed electrode potential (i.e. centers of transduction with respect to the centers of reflection). This is an ideal situation on a conventional orientation for being able to implement a unidirectional transducer. If the electrodes located $+\lambda/8$ relative to the potential are loaded with additional metal, the transducer becomes unidirectional in one direction. If the other set of electrodes located $-\lambda/8$ relative to the potential are loaded with additional metal, the transducer becomes unidirectional in the opposite direction.

On an NSPUDT orientation, as disclosed in U.S. Pat. No. 4,910,839, there is a relative shift of $\lambda/8$ ($\pm 45°$ or $\pm 135°$) between the centers of transduction and reflection. A simple way to view this is to imagine that for reflection properties only, the electrodes are displaced $\lambda/8$ from their physical locations. In consequence, on an NSPUDT crystal orientation, reflection centers can only be introduced into either the CSPUDT or "Hopscotch" transducer configurations at locations corresponding to the zero crossings or peaks of the potential. This is the same situation as a two-electrode/wavelength transducer on a conventional crystal orientation. Thus, the only consequence of introducing electrode reflections into the structures on NSPUDT orientations would be to distort the form of input conductance. Both structures would remain completely bi-directional.

If a transducer configuration is desired which can be made unidirectional on both conventional and NSPUDT orientations, the electrode placement must be such that reflections can be introduced either "in phase" with the imposed potential or displaced by $\pm\lambda/8$. This is achieved by the new configurations shown in FIGS. 1A and 2A. The structures are bi-directional with single level electrodes as shown in FIGS. 1A and 2A.

Figure 1D:
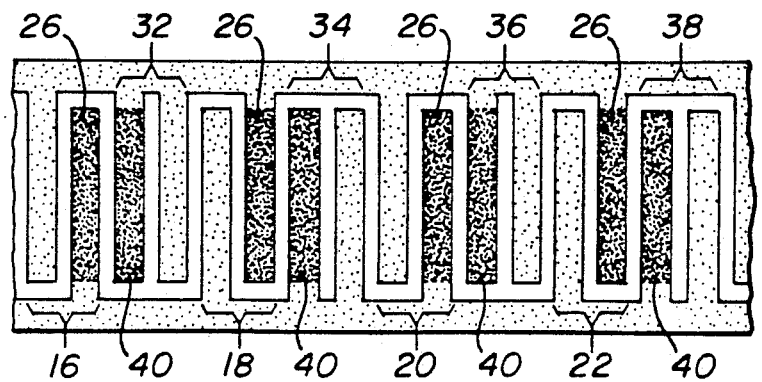
FIG. 1D is a schematic representation of the transducer of FIG. 1A with certain electrodes mass loaded or weighted to give a forward unidirectional transmission on a substrate with a conventional crystal orientation.
Figure 1E:
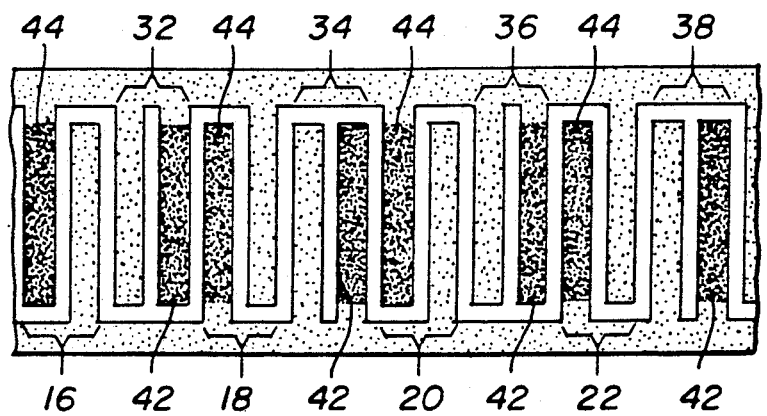
FIG. 1E is a schematic representation of the transducer in FIG. 1A in which certain electrodes are weighted to give a reverse unidirectional transmission on a substrate with a conventional crystal orientation.
Figure 1F:
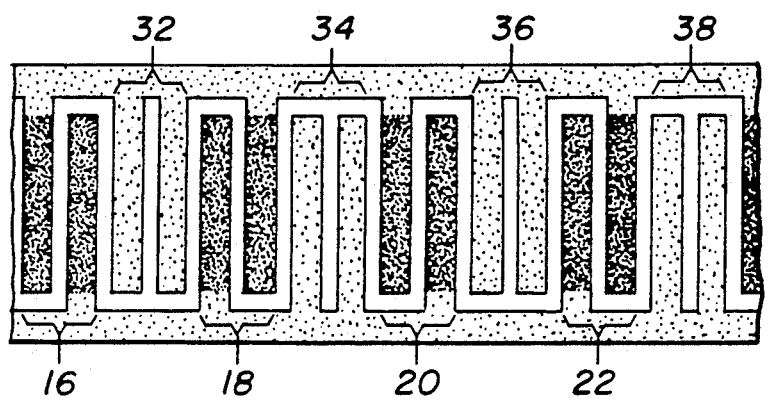
FIG. 1F is a schematic representation of the transducer illustrated in FIG. 1A in which the proper electrodes have been mass weighted to obtain forward unidirectional transmission on a crystal substrate with an NSPUDT orientation.
Figure 1G:
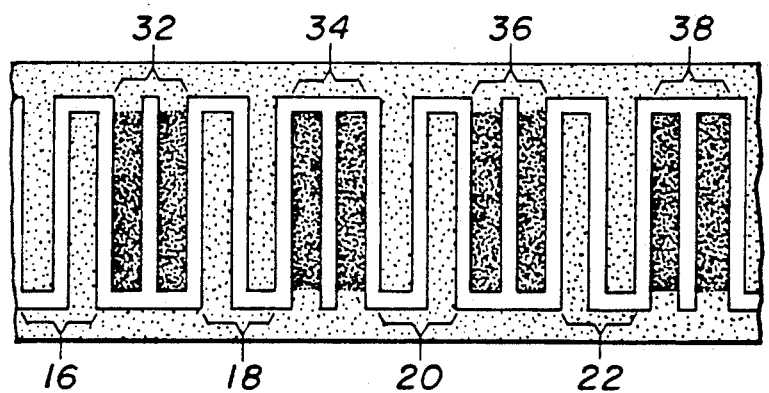
FIG. 1G is a schematic representation of the transducer structure in FIG. 1A illustrating the mass loading of the proper electrodes necessary to provide a reverse unidirectional transmission on a crystal substrate with an NSPUDT crystal orientation.

In FIGS. 1D and 1E, two level versions of the ⅜λ sample transducer structure are shown that will exhibit unidirectional characteristics on conventional crystal orientations. In FIGS. 1F and 1G, two level versions of the ⅜λ group sample transducer structure are shown that will exhibit unidirectional characteristics on NSPUDT orientations. In both cases, the sense of directivity is reversed simply by changing the second level metalization. Thus, as shown in FIG. 1D, by mass loading only one electrode 40 of each of the second pair of electrodes 32, 34, 36 and 38 and its adjacent electrode 26 (all of the adjacent electrodes in FIG. 1D have been numbered 26), unidirectional transmission can be obtained in one direction in the substrate.

In FIG. 1E, if only the other electrode 42 of each of the second pair of electrodes 32, 34, 36 and 38 and its adjacent electrode 44 is mass loaded, then unidirectional transmission will occur in the other direction in the substrate.

If the transducer shown in FIG. 1A is utilized in a natural (NSPUDT) configuration, where the structure and the interdigitated electrodes are positioned on the substrate so as to establish centers of reflection and transduction in the substrate that are separated by $\pm 45°$ or $\pm 135°$ as set forth in U.S. Pat. No. 4,910,839, and mass loading of only each of the first pair of electrodes 16, 18, 20 and 22 is accomplished as illustrated in FIG. 1F, unidirectional transmission occurs in one direction on the substrate in the NSPUDT configuration. If only the second pairs of electrodes 32, 34, 36 and 38 are mass loaded as shown in FIG. 1G, then unidirectional transmission occurs in the reverse direction on the substrate in the NSPUDT configuration.

Thus, the real advantages of the ⅜λ GSPUDT structure can now be understood. In the embodiments illustrated in FIGS. 1A, 1B and 1C, the transducer is a single level reflectionless conventional transducer that radiates in both directions. When it is mass loaded as illustrated in FIG. 1D on conventional crystal orientations, it becomes unidirectional in one direction. When mass loaded as illustrated in FIG. 1E on a conventional crystal orientation, it becomes unidirectional in the other direction. When mass loaded as illustrated in FIG. 1F, it becomes unidirectional on an NSPUDT configuration in one direction. When mass loaded as illustrated in FIG. 1G, it becomes unidirectional in the opposite direction on an NSPUDT configuration. The same mass loading of FIGS. 1D, 1E, 1F and 1G can, of course, be applied to FIGS. 1B and 1C.

The same analysis of FIGS. 1A–1G can be made with respect to FIGS. 2A–2E. The only difference is the size of the sample, which is a ⅝λ sampling with a 5λ grouping.

In addition to the fact that the new ⅜λ and ⅝λ sampled transducer structures can be made unidirectional on both conventional and NSPUDT orientations, they have the significant advantages set forth earlier. Perhaps the principal of these is increased coupling. The ⅜λ structure is not nearly as undersampled as the "Hopscotch" transducer. As a result, it has approximately twice the coupling of the two-group "Hopscotch". Compare FIG. 5 and FIG. 7. This will significantly increase the bandwidth, or reduce the minimum insertion loss, achievable with this technology. For the same second level metal thickness, it also should be possible to achieve slightly higher distributed reflectivity values. Furthermore, the ⅜λ GSPUDT has a 3λ group or repetition length compared to for the two-group "Hopscotch". In consequence, the undesired group responses are removed further from the passband. Compare FIG. 5 with FIG. 7. Finally, since these GSPUDT configurations are periodically sampled, unlike the "Hopscotch", their design and analysis is much simpler.

For optimum performance from the ⅜λ GSPUDT, the electrode widths should be λ/4. The corresponding gap widths in the device would then be λ/8 giving it the same minimum geometry as the CSPUDT. However, in contrast to the latter, with λ/4 electrode widths, good reflectivity value should be readily achievable. See FIGS. 4 and 8. The λ/8 minimum geometry would, of course, limit the ⅜λ GSPUDT to lower frequencies than the "Hopscotch". However, at these frequencies it will perform significantly better. As the frequency is increased, the gaps of the ⅜λ GSPUDT can be increased to 3/16λ and the electrodes can also be 3/16λ. The disadvantage of using electrodes and gaps having the same width is that some reflectivity is lost. The value of a reflection coefficient from a 3/16λ electrode is not as high as a ¼λ electrode. Note also in FIG. 5 the group responses that are generated by the two-group "Hopscotch". They are all approximately the same amplitude and the group response below the center frequency is within 40% of the center frequency. These group responses below center frequency have to be rejected by matching of the device. However, there are spurious bulkwave responses associated with the group responses. In particular, the group response at 60% of center frequency can give rise to a bulkwave response that can closely approach the desired center frequency. The response just above the 1 MHz frequency is, again, approximately 40% removed from the central frequency and the matching network can remove that group response and the others at higher frequencies. By comparison, in FIG. 7, the only group response is shown at approximately 30% of center frequency which is well below the passband and it has a very low absolute magnitude of approximately 0.18. Thus, it occurs at approximately 70% down in frequency and with a very small amplitude. The group response at approximately 70% above center frequency can be removed by a matching network. It can give rise to bulkwave responses that are even further removed from center frequency and thus are not detrimental. The reflectivity of the ⅜λ two-level GSPUDT shown in FIG. 8 can be compared to the reflectivity of a two-electrode/-wavelength transducer in FIG. 4 and with the two-group "Hopscotch" reflectivity in FIG. 6.

If the filters, resonators and other devices that use the transducers need to operate at a higher frequency, the ⅝λ two-level GSPUDT transducer can be used. The difference, of course, is in the width of the electrodes which allows the ⅝λ structure to be used at higher frequencies. As can be seen in FIG. 9, the coupling of the ⅝λ two-level GSPUDT is considerably lower than the ⅜λ two-level GSPUDT. For this reason, the ⅝λ structure is best used only at high frequencies where the ⅜λ structure cannot be used. For the highest frequencies, the electrodes of the ⅝λ two-level GSPUDT are 5/16λ and the gaps are also 5/16λ. The ⅝λ two-level GSPUDT structure has group responses similar to the "Hopscotch". Thus, as can be seen in FIG. 9, the group response at approximately 60% of the center frequency is identical in amplitude to the center frequency and is substantially identical to the "Hopscotch" group response shown in FIG. 5 except with a little higher coupling. Further, because the minimum geometry for the "Hopscotch" structure is ¼λ, the ⅝λ two-level GSPUDT structure can be built at frequencies 25% higher than the "Hopscotch".

Figure 11:
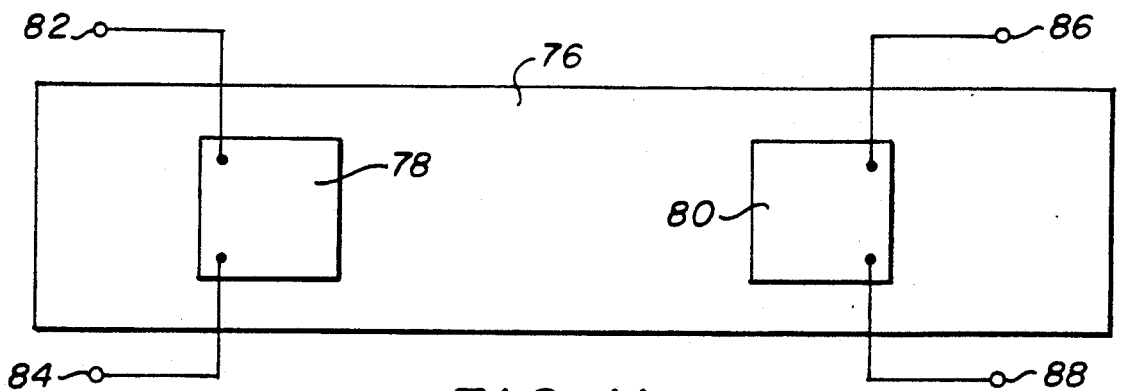
FIG. 11 is a diagrammatic representation of a filter or resonator device that utilizes the novel $\frac{3}{8}$ths and $\frac{3}{8}$ths transducer structures disclosed herein.

FIG. 11 discloses a generalized surface acoustic wave device for forming filters, resonators and the like. The piezoelectric crystal substrate 76 has a first transducer 78 and a second transducer 80 in spaced alignment thereon. Input signals may be introduced into the device at terminals 82 and 84 and output signals may be taken from terminals 86 and 88. Thus, either one or both of transducers 78 and 80 can be the ⅜λ GSPUDT structure, or the ⅝λ GSPUDT structure. Either a ⅜λ or ⅝λ GSPUDT transducer on an NSPUDT crystal orientation, with appropriately weighted electrodes, could be made to radiate unidirectionally towards the other transducer. Thus, filters, resonators and like devices can be constructed in the manner generally illustrated with the structures in FIG. 11.

Figure 12:
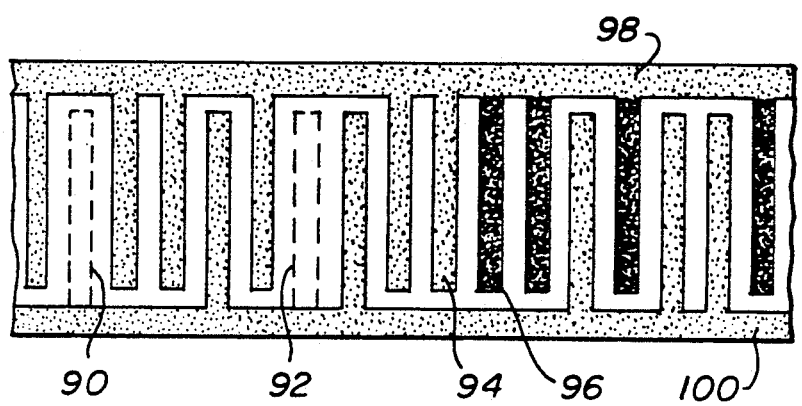
FIG. 12 is a diagrammatic representation of either the $\frac{3}{8}\lambda$ or $\frac{3}{8}\lambda$ structure of the present invention illustrating typical withdrawal weighting techniques.

As stated earlier, either of the novel ⅜λ or ⅝λ GSPUDTs may be selectively weighted as desired by means well known in the art to give a desired transduction or reflection characteristic. As shown in FIG. 12, for example only, certain electrodes may be completely removed such as electrodes 90 and 92 shown in dashed lines to achieve a desired transduction. The ⅜λ or ⅝λ grid spacing for the structure is not changed. Other electrodes may be kept on the same grid spacing but connected to neither conductive pad 98 or 100 to maintain constant velocity but are otherwise withdrawn. Such electrodes, shown for example only, as electrodes 94 and 96 in FIG. 12. Withdrawal weighting of the second level, as indicated for example only, may be used to achieve desired reflection characteristics. Withdrawal weighting of any form of either or both levels may be used as indicated so long as the electrodes lie on the ⅜λ or ⅝λ grid and adjacent electrodes have the ⅜λ or ⅝λ spacing.

Figure 13:
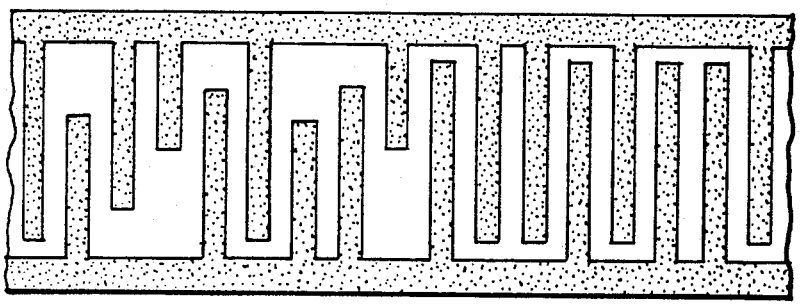
FIG. 13 is a diagrammatic representation of either the $\frac{3}{8}\lambda$ or $\frac{3}{8}\lambda$ structure of the present invention illustrating typical overlap weighting techniques.

FIG. 13 illustrates, for example, how overlap weighting techniques, will known in the art, can be utilized with the novel ⅜λ and ⅝λ GSPUDT transducers to obtain a desired transduction characteristic.

Figure 14:
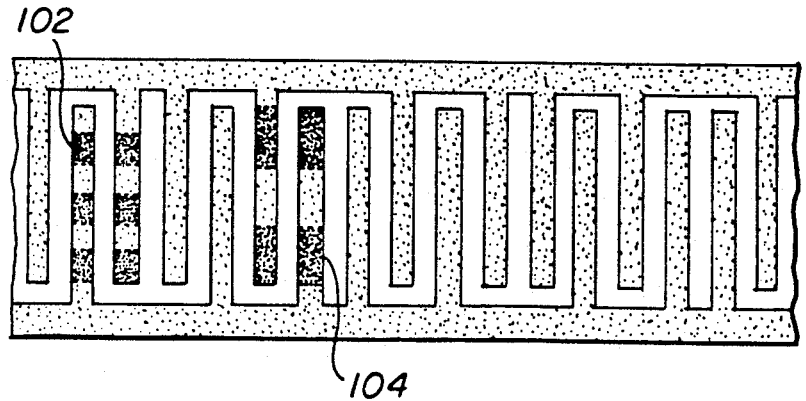
FIG. 14 is a diagrammatic representation of either the $\frac{3}{8}\lambda$ or $\frac{3}{8}\lambda$ structure of the present invention illustrating typical analogue weighting techniques with additional metal to obtain a desired reflectivity characteristic.

FIG. 14 illustrates how selective second-level mass weighting of the electrodes can be of the analogue type instead of uniform loading or weighting. Thus, the weighting 102 and 104 of successive electrodes can be weighted in any desired progression to obtain a desired reflectivity characteristic.

Thus, there has been disclosed novel GSPUDT structures with ⅜λ and ⅝λ group sampling with 3λ and 5λ group responses. Reflectionless or unidirectional transducers, and broadband notch elements are all implementable with these new configurations. These GSPUDTs are similar to the conventional SPUDT and the "Hopscotch" transducers in that single level versions are reflectionless. Unidirectional characteristics are only obtainable from a two-level structure. However, they have significant advantages over either of the previous structures in many cases. With the present novel structures, unidirectional characteristics can be obtained on either standard or NSPUDT crystal orientations. The sense of the unidirectionality can be reversed by a simple change to the second level metalization. They have excellent coupling, low group responses, no bulkwave problem and much lower insertion losses. Thus, this type of transducer can be used in combination with an NSPUDT transducer to implement a low-loss filter, resonator or the like device.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. An improved surface acoustic wave transducer comprising:
   a pattern of at least three adjacent interdigitated electrodes on a piezoelectric substrate; and
   each of said interdigitated electrodes lying on a $\frac{3}{8}\lambda$ grid such that adjacent electrodes have a center-to-center spacing of $\frac{3}{8}\lambda$ where $\lambda =$ one wavelength.

2. An improved surface acoustic wave transducer as in claim 1 wherein said electrodes are selectively weighted to obtain a desired transduction characteristic.

3. An improved surface acoustic wave transducer as in claim 2 wherein said weighting to obtain a desired transduction is withdrawal weighting.

4. An improved surface acoustic wave transducer as in claim 2 wherein said weighting to obtain a desired transduction characteristic is overlap weighting.

5. An improved surface acoustic wave transducer as in claim 1 wherein said electrodes are selectively weighted with additional overlay material to obtain a desired reflectivity characteristic.

6. An improved surface acoustic wave transducer as in claim 5 wherein said weighting to obtain a desired reflectivity is analogue weighting.

7. An improved surface acoustic wave transducer comprising:
   a pattern of at least three adjacent interdigitated electrodes on a piezoelectric substrate; and
   each of said interdigitated electrodes lying on a $\frac{3}{8}\lambda$ grid such that adjacent electrodes have a center-to-center spacing on $\frac{3}{8}\lambda$ where $\lambda =$ one wavelength.

8. An improved surface acoustic wave transducer as in claim 7 wherein said electrodes are selectively weighted to obtain a desired transduction characteristic.

9. An improved surface acoustic wave transducer as in claim 8 wherein said weighting to obtain a desired transduction is withdrawal weighting.

10. An improved surface acoustic wave transducer as in claim 8 wherein said weighting to obtain a desired transduction characteristic is overlap weighting.

11. An improved surface acoustic wave transducer as in claim 7 wherein said electrodes are selectively weighted with additional overlay material to obtain a desired reflectivity characteristic.

12. An improved surface acoustic wave transducer as in claim 11 wherein said weighting to obtain a desired reflectivity is analogue weighting.

13. A surface acoustic wave transducer as in claim 1 wherein said pattern of interdigitated electrodes comprises:
   a plurality of first pairs of interdigitated electrodes, each said first pair of electrodes having reversed polarity from the preceding first pair;
   a plurality of second pairs of electrodes interdigitated with said plurality of first pairs of electrodes; and
   both electrodes in each second pair having a polarity opposite the polarity of the adjacent one of the first pair of electrodes.

14. A surface acoustic wave transducer as in claim 13 further comprising:
   mass loading on only one corresponding electrode of each of the second pair of electrodes and its adjacent first pair electrode to obtain unidirectional transmission in one direction in the substrate; and
   mass loading on only the corresponding other one electrode of each of the second pair of electrodes and its adjacent first pair electrode to obtain unidirectional transmission in the other direction in the substrate.

15. A surface acoustic wave transducer as in claim 13 further including:
   said interdigitated electrodes positioned on said substrate to establish centers of reflection and transduction in said substrate that are separated by $\pm 45°$ or $\pm 135°$;
   mass loading on only each electrode in each pair of electrodes to obtain unidirectional transmission in one direction on the substrate; and
   mass loading on only each electrode in each second pair of electrodes to obtain unidirectional transmission in the reverse direction on the substrate.

16. A surface acoustic wave transducer as in claim 7 wherein said pattern of interdigitated electrodes comprises:
   a plurality of first pairs of interdigitated electrodes, each said first pair of electrodes having reversed polarity from the preceding first pair;
   a plurality of second pairs of electrodes interdigitated with said plurality of first pairs of electrodes; and
   both electrodes in each second pair having a polarity opposite the polarity of the adjacent one of the first pair of electrodes.

17. A surface acoustic wave transducer as in claim 16 further comprising:
   mass loading on only one corresponding electrode of each of the second pair of electrodes and its adjacent first pair electrode to obtain unidirectional transmission in one direction in the substrate; and
   mass loading on only the corresponding other electrode of each of the second pair of electrodes and its adjacent first pair electrode to obtain unidirectional transmission in the other direction in the substrate.

18. A surface acoustic wave transducer as in claim 16 further including:
   said interdigitated electrodes positioned on said substrate to establish centers of reflection and transduction in said substrate that are separated by $\pm 45°$ or $\pm 135°$;
   mass loading on only each electrode in each first pair of electrodes to obtain unidirectional transmission in one direction on the substrate; and
   mass loading on only each electrode in each second pair of electrodes to obtain unidirectional transmission in the reverse direction on the substrate.

19. A surface acoustic wave transducer as in claim 1 wherein the pattern of electrodes repeats itself each three wavelengths.

20. A surface acoustic wave transducer as in claim 19 wherein:
   each of said electrodes has a width of $\lambda/4$; and
   adjacent electrodes are separated by a gap of $\lambda/8$.

21. A surface acoustic wave transducer as in claim 19 wherein:
   each of said electrodes has a width of $\lambda/8$; and
   adjacent electrodes are separated by a gap of $\lambda/4$.

22. A surface acoustic wave transducer as in claim 19 wherein:
   each of said electrodes has a width of $3/16\lambda$; and
   adjacent electrodes are separated by a gap of $3/16\lambda$.

23. A surface acoustic wave transducer as in claim 7 wherein the pattern of electrodes repeats itself each five wavelengths.

24. A surface acoustic wave transducer as in claim 23 wherein:
   each of said electrodes have a width of $\frac{3}{8}\lambda$; and
   adjacent electrodes are separated by a gap of $\lambda/4$.

25. A surface acoustic wave transducer as in claim 23 wherein:
   each of said electrodes has a width of $\lambda/4$ and;
   adjacent electrodes are separated by a gap of $\frac{3}{8}\lambda$.

26. A surface acoustic wave transducer as in claim 23 wherein:
   each of said electrodes has a width of $5/16\lambda$; and
   adjacent electrodes are separated by a gap of $5/16\lambda$.

27. In a surface acoustic wave device of the type having input and output spaced aligned transducers on a crystal substrate, the improvement comprising:
   said transducers positioned on said substrate to establish centers of reflection and transduction in said substrate that are separated by $\pm 45°$ or $\pm 135°$; and
   at lease one of said transducers being the transducer of claim 1.

28. In a surface acoustic wave device of the type having input and output spaced aligned transducers, the improvement comprising at least one of said transducers being the transducer of claim 1.

29. In a surface acoustic wave device of the type having input and output spaced aligned transducers on a crystal substrate, the improvement comprising:
   said transducers positioned on said substrate to establish centers of reflection and transduction in said substrate that are separated by $\pm 45°$ or $\pm 135°$; and
   at least one of said transducers being the transducer of claim 7.

30. In a surface acoustic wave device of the type having input and output spaced aligned transducers, the improvement comprising at least one of said transducers being the transducer of claim 7.

31. In a surface acoustic wave filter of the type having input and output spaced aligned transducers, the improvement comprising:
   at least one of the transducers being the transducer of claim 1; and
   mass loading on predetermined ones of the electrodes of said at least one of said transducers so as to enable said transducers to communicate with each other.

32. In a surface acoustic wave filter of the type having input and output spaced aligned transducers, the improvement comprising:
   at least one of the transducers being the transducer of claim 7; and
   mass loading on predetermined ones of the electrodes of said at least one of said transducers so as to enable said transducers to communicate with each other.

33. In a surface acoustic wave filter of the type having input and output spaced aligned transducers on a crystal substrate, the improvement comprising:
   at least one of the transducers being the transducer of claim 1;
   the transducers positioned on the substrate to establish centers of reflection and transduction in the substrate that are separated by $\pm 45°$ or $\pm 135°$; and
   mass loading on predetermined ones of the electrodes of said at least one of said transducers so as to enable said transducers to communicate with each other.

34. In a surface acoustic wave filter of the type having input and output spaced aligned transducers on a crystal substrate, the improvement comprising:
   at least one of the transducers being the transducer of claim 7;
   the transducers positioned on the substrate to establish centers of reflection and transduction in the substrate that are separated by $\pm 45°$ or $\pm 135°$; and
   mass loading on predetermined ones of the electrodes of said at least one of said transducers so as to enable said transducers to communicate with each other.

* * * * *